United States Patent
Xu et al.

(10) Patent No.: US 12,484,375 B2
(45) Date of Patent: Nov. 25, 2025

(54) DISPLAY PANEL AND DISPLAY APPARATUS

(71) Applicant: KunShan Go-Visionox Opto-Electronics Co., Ltd., Jiangsu (CN)

(72) Inventors: Chuanzhi Xu, Kunshan (CN); Lu Zhang, Kunshan (CN); Zhengfang Xie, Kunshan (CN)

(73) Assignee: KunShan Go-Visionox Opto-Electronics Co., Ltd., KunShan (CN)

(*) Notice: Subject to any disclaimer, the term of this patent is extended or adjusted under 35 U.S.C. 154(b) by 968 days.

(21) Appl. No.: 17/592,088

(22) Filed: Feb. 3, 2022

(65) Prior Publication Data

US 2022/0157895 A1    May 19, 2022

Related U.S. Application Data

(63) Continuation of application No. PCT/CN2020/132459, filed on Nov. 27, 2020.

(30) Foreign Application Priority Data

Jan. 6, 2020 (CN) .......................... 202010008641.7

(51) Int. Cl.
*H10K 59/121* (2023.01)
*G09G 3/3208* (2016.01)
(Continued)

(52) U.S. Cl.
CPC ......... *H10K 59/121* (2023.02); *H10K 59/131* (2023.02); *H10K 59/179* (2023.02);
(Continued)

(58) Field of Classification Search
CPC .... H10K 59/121; H10K 59/65; H10K 59/131; H10K 59/179; H10K 59/122;
(Continued)

(56) References Cited

U.S. PATENT DOCUMENTS

| | | | |
|---|---|---|---|
| 2016/0163256 A1* | 6/2016 | Hochman | G09G 3/3208 315/161 |
| 2019/0393286 A1 | 12/2019 | Ding et al. | |
| 2020/0052048 A1* | 2/2020 | Kuo | G06F 1/1605 |

FOREIGN PATENT DOCUMENTS

| | | |
|---|---|---|
| CN | 107610635 A | 1/2018 |
| CN | 108269840 A | 7/2018 |

(Continued)

OTHER PUBLICATIONS

Wrzesniewski, Edward Joseph. "Structural and Optical Enhancement of Organic Light Emitting Diodes." ProQuest Dissertations & Theses, 2012. Print. (Year: 2012).*

(Continued)

*Primary Examiner* — Shih Tsun A Chou
(74) *Attorney, Agent, or Firm* — Maier & Maier, PLLC

(57) ABSTRACT

A display panel and a display apparatus. The display panel includes a first display area, a second display area and a transition display area. The display panel includes: a plurality of first pixel units in the first display area; a plurality of third pixel units in the transition display area; a plurality of first pixel circuit units in the transition display area and electrically connected with the first pixel units; and a plurality of third pixel circuit units in the transition display area and electrically connected with the third pixel units. The transition display area is divided into a plurality of sub-areas, each of the sub-areas is an area occupied by a corresponding third pixel unit, each of the sub-areas accommodates a third pixel circuit unit, which is electrically connected with the corresponding third pixel unit, and at least one first pixel circuit unit.

20 Claims, 6 Drawing Sheets

(51) Int. Cl.
  *H10K 59/131* (2023.01)
  *H10K 59/179* (2023.01)
  *H10K 59/65* (2023.01)
  *H10K 59/80* (2023.01)

(52) U.S. Cl.
  CPC ... *G09G 3/3208* (2013.01); *G09G 2300/0426* (2013.01); *G09G 2300/0465* (2013.01); *H10K 59/65* (2023.02); *H10K 59/805* (2023.02)

(58) Field of Classification Search
  CPC .............. H10K 50/11; G09G 3/3208; G09G 2300/0426; G09G 2300/0465
  See application file for complete search history.

(56) References Cited

FOREIGN PATENT DOCUMENTS

| | | | | |
|---|---|---|---|---|
| CN | 108735790 | A | | 11/2018 |
| CN | 208607570 | U | | 3/2019 |
| CN | 109801903 | A | | 5/2019 |
| CN | 109801950 | A | | 5/2019 |
| CN | 110061038 | A | | 7/2019 |
| CN | 110148621 | A | | 8/2019 |
| CN | 110189639 | A | * 8/2019 | ............... G09F 9/30 |
| CN | 110265455 | A | | 9/2019 |
| CN | 110278300 | A | * 9/2019 | ........... G06F 1/1605 |
| CN | 110392146 | A | | 10/2019 |
| CN | 110459175 | A | | 11/2019 |
| CN | 110489012 | A | | 11/2019 |
| CN | 110491917 | A | | 11/2019 |
| CN | 110491918 | A | | 11/2019 |
| CN | 110492018 | A | | 11/2019 |
| CN | 110503911 | A | | 11/2019 |
| CN | 110504287 | A | | 11/2019 |
| CN | 110504289 | A | | 11/2019 |
| CN | 110599944 | A | | 12/2019 |
| CN | 110632789 | A | | 12/2019 |
| CN | 110648624 | A | | 1/2020 |
| CN | 110649080 | A | | 1/2020 |
| CN | 110650232 | A | | 1/2020 |
| CN | 111048005 | A | | 4/2020 |
| DE | 102015016431 | A1 | | 8/2016 |
| JP | 2018081916 | A | | 5/2018 |
| JP | 2022550563 | A | | 12/2022 |
| KR | 1020120019025 | A | | 3/2012 |

OTHER PUBLICATIONS

Search Report issued on May 24, 2023, in corresponding European Application No. 20912983.2, 11 pages.

Office Action issued on Jun. 6, 2023, in corresponding Japanese Application No. 2022-540645, 8 pages.

The International Search Report (with English Translation) and Written Opinion issued on Feb. 25, 2021 in corresponding International Application No. PCT/CN2020/132459, 13 pages.

The First Office Action issued on Apr. 2, 2021, in connection with corresponding Chinese Application No. 202010008641.7, (9 pages, including English translation of brief information).

The First Office Action dated Oct. 12, 2022, corresponding to Indian Application No. 202217039051, 5 pages.

Office Action issued on Oct. 24, 2023, in corresponding Japanese Application No. 2022-540645, 4 pages.

Office Action issued on Sep. 20, 2024, in corresponding Korean Application No. 10-2022-7023996, 15 pages.

* cited by examiner

DISPLAY PANEL AND DISPLAY APPARATUS

CROSS REFERENCE TO RELATED APPLICATION

The present application is a continuation of International Application No. PCT/CN2020/132459 filed on Nov. 27, 2020, which claims the benefit of priority to Chinese Patent Application No. 202010008641.7 filed on Jan. 6, 2020, both of which are incorporated herein by reference in their entireties.

TECHNICAL FIELD

The present application relates to the field of display, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer need to integrate a front camera, a telephone receiver, an infrared sensing assembly and the like. In the prior art, a notch or a hole may be formed in the display screen so that external light can enter the photosensitive assembly under the screen through the notch or the hole. Nonetheless, these electronic devices do not achieve a real full-screen display, and cannot display an image in all areas of the entire screen. For example, the area corresponding to the front camera cannot display the image.

SUMMARY

The present application provides a display panel and a display apparatus, at least part of an area of the display panel can transmit light and be used for display, thereby facilitating an under-screen integration of the photosensitive assembly.

In one aspect, the embodiments of the present application provide a display panel comprising a first display area, a second display area and a transition display area between the first display area and the second display area, a light transmittance of the first display area being greater than a light transmittance of the second display area, the display panel comprises: a plurality of first pixel units in the first display area; a plurality of third pixel units in the transition display area; a plurality of first pixel circuit units in the transition display area and electrically connected with the first pixel units, the first pixel circuit units being configured to drive the first pixel units for display; and a plurality of third pixel circuit units in the transition display area and electrically connected with the third pixel units, the third pixel circuit units being configured to drive the third pixel units for display, wherein the transition display area is divided into a plurality of sub-areas, and each of the sub-areas is an area occupied by a corresponding third pixel unit, and each of the sub-areas accommodates a third pixel circuit unit, which is electrically connected with the corresponding third pixel unit, and at least one first pixel circuit unit.

In another aspect, the embodiments of the present application provide a display apparatus comprising the display panel of any one of the above embodiments.

According to the display panel of the embodiments of the present application, the light transmittance of the first display area is greater than the light transmittance of the second display area, so that a photosensitive assembly can be integrated on the rear of the first display area of the display panel. The under-screen integration is achieved for the photosensitive assembly such as a camera, and moreover, the first display area can display the image, thus the display area of the display panel is increased, and a full-screen design is achieved for the display apparatus. The first pixel circuit units configured to drive the first pixel units for display are in the transition display area, so that the wiring structure of the first display area is reduced and the light transmittance of the first display area is improved.

The transition display area is divided into a plurality of sub-areas, and each of the sub-areas accommodates the third pixel circuit unit, which is electrically connected with the corresponding third pixel unit, and at least one first pixel circuit unit. Each of the third pixel circuit units in the transition display area is in an area occupied by the third pixel unit which is correspondingly driven by the third pixel circuit unit, and the third pixel circuit unit and the corresponding third pixel unit are closer to each other, which facilitates the electric connection between them and avoids the need for a long lead wire to achieve the electric connection. Therefore, more wiring space in the transition display area can be saved, the arrangement of the lead wires for connecting the first pixel circuits unit and the first pixel units is facilitated, and the problem of wiring conflict of the first pixel circuit units and the third pixel circuit units in the transition display area is avoided. More space of the transition display area is used to arrange the lead wires for connecting the first pixel circuit units and the first pixel units, so that a greater number of the lead wires can be arranged, which provides a driving basis for an increase of the pixel density of the first display area.

BRIEF DESCRIPTION OF THE DRAWINGS

FIG. 6 shows a cross-sectional view taken along the line N-N in FIG. 3a;

DETAILED DESCRIPTION

To make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details.

In an electronic device such as a cell phone and a tablet computer, it is needed to integrate a photosensitive assembly such as a front camera, an infrared light sensor and a proximity light sensor at the side where the display panel is arranged. For example, a light-transmitting display area may be arranged in the above electronic device, and the photosensitive assembly is arranged on the rear of the light-transmitting display area. A full-screen display is achieved for the electronic device while the photosensitive assembly is guaranteed to work normally.

In order to increase the light transmittance of the light-transmitting display area, a transition display area may be arranged between the light-transmitting display area and a non-light-transmitting display area, so that the pixel circuits originally located in the light-transmitting display area can be arranged in the transition display area. Nonetheless, both the pixel circuits for driving the sub-pixels in the transition display area for display and the pixel circuits for driving the sub-pixels in the light-transmitting display area for display need to be placed in the transition display area, a higher requirement is raised for the reasonable arrangement of various pixel circuits in the transition display area.

To solve the above problems, the embodiments of the present application provide a display panel and a display apparatus, which will be described below with reference to the drawings.

The embodiments of the present application provide a display panel, which may be an organic light emitting diode (Organic Light Emitting Diode, OLED) display panel.

Figure 1:
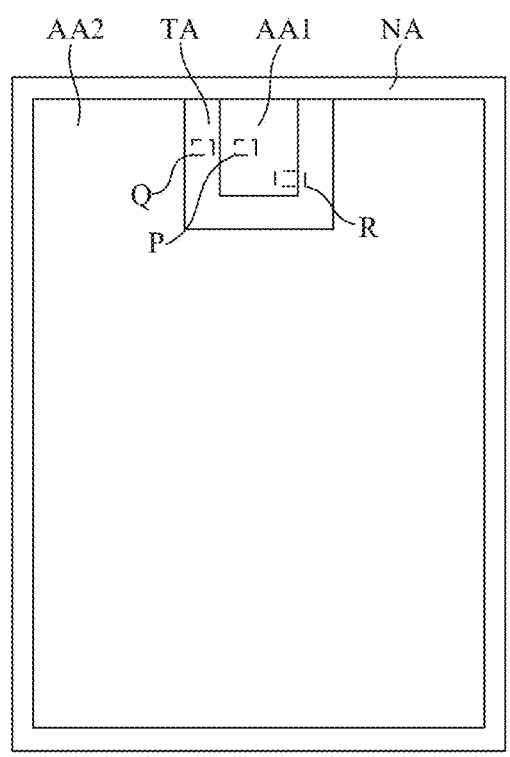
FIG. 1 shows a top view of a display panel provided according to an embodiment of the present application.

FIG. 1 shows a top view of a display panel provided according to an embodiment of the present application. The display panel 100 includes a first display area AA1, a second display area AA2 and a transition display area TA between the first display area AA1 and the second display area AA2. In some embodiments, the display panel 100 further includes a non-display area NA surrounding the first display area AA1 and the second display area AA2. The light transmittance of the first display area AA1 is greater than the light transmittance of the second display area AA2.

In the present application, the light transmittance of the first display area AA1 is greater than or equal to 15%. To ensure that the light transmittance of the first display area AA1 is greater than 15%, or even greater than 40%, or even a higher light transmittance, the light transmittance of at least part of functional films of the first display area AA1 of the display panel 100 in the embodiment is greater than 80%, and even the light transmittance of at least part of the functional films is greater than 90%.

According to the display panel 100 of the embodiments of the present application, the light transmittance of the first display area AA1 is greater than the light transmittance of the second display area AA2, so that the photosensitive assembly may be integrated on the rear of the first display area AA1 of the display panel 100. An under-screen integration is achieved for the photosensitive assembly such as a camera, and moreover, the first display area AA1 can display the image, the display area of the display panel 100 is increased and a full-screen design is achieved for the display apparatus.

Figure 2:
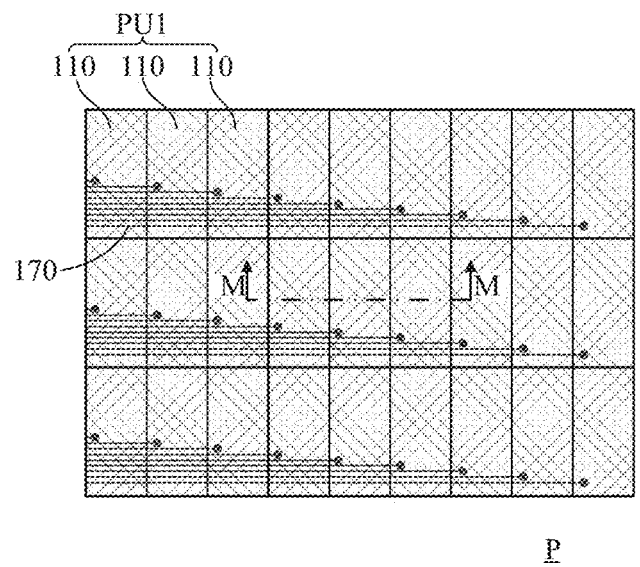
FIG. 2 shows a partial enlarged schematic diagram of the area P in FIG. 1.
Figure 3A:
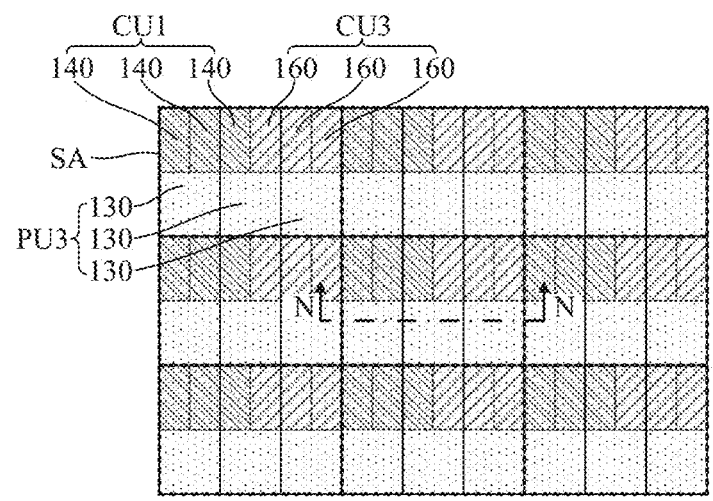
FIG. 3a shows a partial enlarged schematic diagram of the area Q in FIG. 1.
Figure 3B:
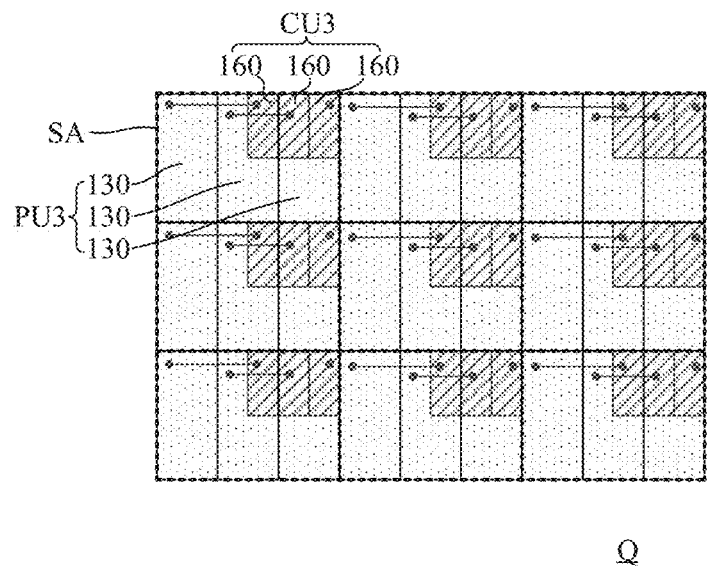
FIG. 3b shows a partial enlarged schematic diagram of the area Q in FIG. 1.
Figure 3C:
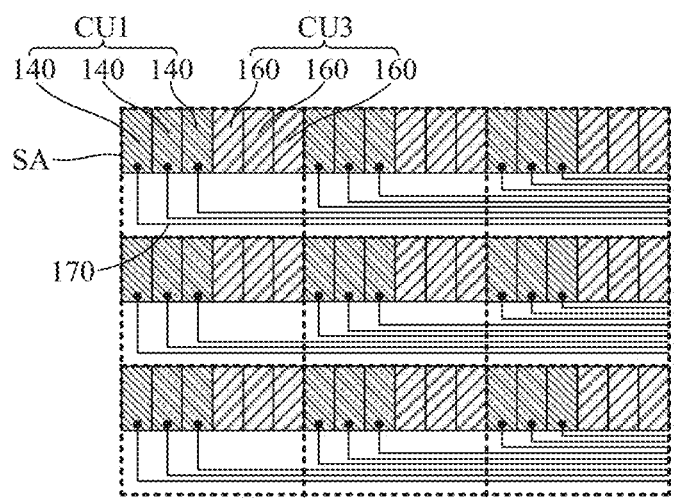
FIG. 3c shows a partial enlarged schematic diagram of the area Q in FIG. 1.
Figure 4:
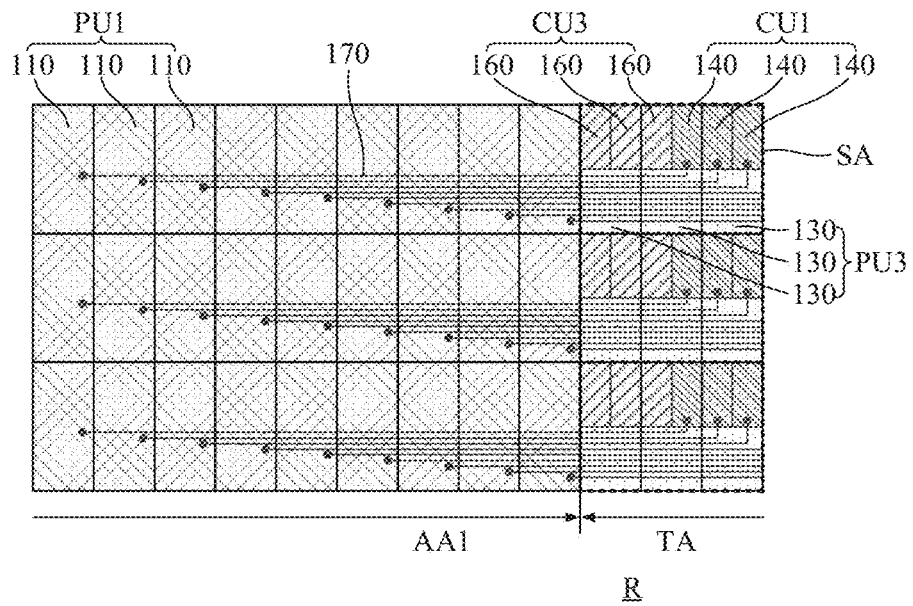
FIG. 4 shows a partial enlarged schematic diagram of the area R in FIG. 1.

FIG. 2 shows a partial enlarged schematic diagram of the area P in FIG. 1. FIGS. 3a, 3b and 3c show partial enlarged schematic diagrams of the area Q in FIG. 1, in which different parts of the structure of the transition display area TA are not shown to clearly illustrate the structure. FIG. 4 shows a partial enlarged schematic diagram of the area R in FIG. 1.

The display panel 100 includes a plurality of first pixel units PU1, a plurality of second pixel units, a plurality of third pixel units PU3, a plurality of first pixel circuit units CU1, a plurality of second pixel circuit units, and a plurality of third pixel circuit units CU3.

The first pixel units PU1 are in the first display area AA1, the second pixel units are in the second display area AA2, and the third pixel units PU3 are in the transition display area TA.

The first pixel circuit units CU1 are in the transition display area TA and electrically connected with the first pixel units PU1, the first pixel circuit units CU1 are configured to drive the first pixel units PU1 for display.

The second pixel circuit units are in the second display area AA2 and electrically connected with the second pixel units, the second pixel circuit units are configured to drive the second pixel units for display.

The third pixel circuit units CU3 are in the transition display area TA and electrically connected with the third pixel units PU3, the third pixel circuit units CU3 are configured to drive the third pixel units PU3 for display.

As shown in FIGS. 3a, 3b and 3c, the transition display area TA is divided into a plurality of sub-areas SA, and the boundary of each of the sub-areas SA is shown with dotted line. Each of the sub-areas SA is an area occupied by a corresponding third pixel unit PU3. Herein, each of the sub-areas SA accommodates a third pixel circuit unit CU3, which is electrically connected with the corresponding third pixel unit PU3, and at least one first pixel circuit unit CU1.

In order to clearly show the structure of the transition display area TA, the lead wire structure is not shown in FIG. 3a to conveniently illustrate that each of sub-areas SA includes third pixel units PU3, third pixel circuit units CU3 and first pixel circuit units CU1. The first pixel circuit unit CU1 is not shown in FIG. 3b to conveniently illustrate the electric connection relationship between the third pixel circuit units CU3 and the corresponding third pixel units PU3 in each of sub-areas SA. As shown in FIG. 3b, the third pixel circuit units CU3 are electrically connected with the third pixel units PU3 through through-holes and a few of lead wires. The third pixel unit PU3 is not shown in FIG. 3c to conveniently illustrate the relative positional relationship between the first pixel circuit units CU1 and the third pixel circuit units CU3.

According to the display panel 100 of the embodiments of the present application, the first pixel circuit units CU1 configured to drive the first pixel units PU1 for display are in the transition display area TA, so that the wiring structure of the first display area AA1 is reduced and the light transmittance of the first display area AA1 is improved.

Each of the third pixel circuit units CU3 in the transition display area TA is in an area occupied by the third pixel unit PU3 which is correspondingly driven by the third pixel circuit unit CU3, and the third pixel circuit unit CU3 and the corresponding third pixel unit PU3 are closer to each other, which facilitates the electric connection between them and avoids the need for a long lead wire to achieve the electric connection. Therefore, more wiring space in the transition display area TA can be saved, the arrangement of the lead wires for connecting the first pixel circuits units CU1 and the first pixel units PU1 is facilitated, and the problem of wiring conflict of the first pixel circuit units CU1 and the third pixel circuit units CU3 in the transition display area TA is avoided.

More space of the transition display area TA is used to arrange the lead wires for connecting the first pixel circuit units CU1 and the first pixel units PU1, so that a greater number of the lead wires can be arranged, which provides a driving basis for an increase of the pixel density (Pixels Per Inch, PPI) of the first display area AA1.

In some embodiments, the pixel density of the first display area AA1 is different from the pixel density of the second display area AA2, and the pixel density of the transition display area TA is the same as the pixel density of the first display area AA1 or the pixel density of the second display area AA2, so that the display difference of the display panel 100 is reduced to a certain degree, and the display uniformity of the display panel 100 is improved.

In some embodiments, the sub-areas SA are arranged in a plurality of rows and a plurality of columns, and the third pixel circuit units CU3 are arranged in a plurality of rows and a plurality of columns. In FIGS. 3a, 3b, and 3c, the row direction of the arrangement of the third pixel circuit units CU3 is, for example, the horizontal direction in the drawings, and the column direction of the arrangement of the third pixel circuit units CU3 is, for example, the vertical direction in the drawings. In some other embodiments, the row direction and the column direction of the arrangement of the third pixel circuit units CU3 may be other extension directions, and the row direction and the column direction cross each other. It can be understood that, in some embodiments, the above rows and columns may also be exchangeable.

In each row of the third pixel circuit units CU3, a first interval area is between two adjacent third pixel circuit units CU3, and the first pixel circuit unit CU1 is in the first interval area. In the embodiment, in each row of third pixel circuit units CU3, one first pixel circuit unit CU1 is arranged between the two adjacent third pixel circuit units CU3.

In some embodiments, a second interval area is between two adjacent rows of the third pixel circuit units CU3, and the first pixel circuit unit CU1 is electrically connected with a corresponding first pixel unit PU1 through a lead wire 170 extending in the second interval area. Each second interval area may extend to the edge of the first display area AA1, so that the lead wires 170 can be arranged in order, and the lead wires 170 can extend to the first display area AA1 by extending through the second interval areas, the existence of a plurality of second interval areas increases the area which can be used to arrange the lead wires 170. When the pixel density of the first display area AA1 increases, the transition display area TA still has more space for arranging a greater number of the lead wires 170, which provides a driving guarantee for the display of the light-transmitting first display area AA1 with a higher pixel density.

Figure 5:
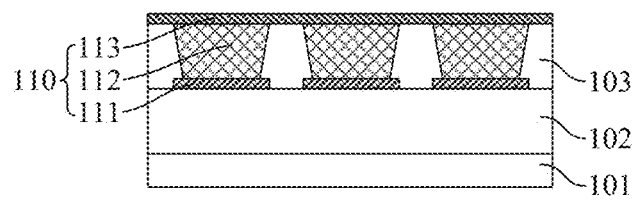
FIG. 5 shows a cross-sectional view taken along the line M-M in FIG. 2.

FIG. 5 shows a cross-sectional view taken along the line M-M in FIG. 2. In some embodiments, the display panel 100 includes a substrate 101, a component layer 102 on the substrate 101 and a pixel defining layer 103 on the component layer 102. The substrate 101 may be made of a light-transmitting material such as glass, Polyimide (PI). The component layer 102 may include the first pixel circuit unit CU1, the second pixel circuit unit and the third pixel circuit unit CU3. The pixel defining layer 103 includes pixel openings for accommodating at least part of the structure of each of the sub-pixels of the display panel 100.

In some embodiments, each of the first pixel units PU1 includes a plurality of first sub-pixels 110. Each of the first sub-pixels 110 includes a first pixel electrode 111, a first light-emitting structure 112 on the first pixel electrode 111 and a first common electrode 113 on the first light-emitting structure 112. One of the first pixel electrode 111 and the first common electrode 113 is an anode, and the other is a cathode. In the present application, for example, the first pixel electrode 111 is the anode and the first common electrode 113 is the cathode.

In some embodiments, each of the first pixel circuit units CU1 includes a plurality of first pixel circuits 140, and each of the first pixel circuits 140 is electrically connected with a first pixel electrode 111 of a corresponding first sub-pixel 110.

At least part of the pixel openings of the pixel defining layer 103 in the first display area AA1 are configured to accommodate the first light-emitting structure 112.

In some embodiments, the first pixel electrode 111 is a light-transmitting electrode. In some embodiments, the first pixel electrode 111 includes an indium tin oxide (Indium Tin Oxide, ITO) layer or an indium zinc oxide (Indium Zinc Oxide, IZO) layer. In some embodiments, the first pixel electrode 111 is a reflective electrode, so that the formed first sub-pixels 110 have a better display effect. The reflective electrode includes a first light-transmitting conductive layer, a reflective layer on the first light-transmitting conductive layer and a second light-transmitting conductive layer on the reflective layer. Herein, the first light-transmitting conductive layer and the second light-transmitting conductive layer may be ITO, IZO or the like, and the reflective layer may be a metal layer, for example, made of silver.

The first light-emitting structure 112 may include an emitting layer (Emitting Layer, EML), and the formed first sub-pixels 110 may be classified into a plurality of types according to the different colors of the light emitted from the EML. In an example, the first sub-pixels 110 include a first sub-pixel 110 which emits red light, a first sub-pixel 110 which emits green light and a first sub-pixel 110 which emits blue light, and other examples are not limited to this. According to the design requirement of the first light-emitting structure 112, the first light-emitting structure 112 may further include at least one of a hole inject layer (Hole Inject Layer, HIL), a hole transport layer (Hole Transport Layer, HTL), an electron inject layer (Electron Inject Layer, EIL) and an electron transport layer (Electron Transport Layer, ETL).

In some embodiments, each of the first sub-pixels 110 includes two or more first pixel electrodes 111, the number of the first light-emitting structures 112 is the same as the number of the first pixel electrodes 111, and the first light-emitting structures 112 and the first pixel electrodes 111 are arranged in one-to-one correspondence. All of the first pixel electrodes 111 in each of the first sub-pixels 110 are electrically connected with each other and electrically connected with a same first pixel circuit 140. When the number of the first pixel electrodes 111 in each of the first sub-pixels 110 is two or more, the colors of the light emitted from the first light-emitting structures 112 included in each of the first sub-pixels 110 are the same, so that the plurality of the first light-emitting structures 112 in each of the first sub-pixels 110 are driven by the same first pixel circuit 140 for display.

In some embodiments, an orthographic projection of each of the first pixel electrodes 111 on the substrate 101 includes one first graphic unit or at least two first graphic units jointed together, and the first graphic unit includes at least one selected from a group including a round shape, an oval shape, a dumb-bell shape, a gourd shape and a rectangle shape, and the diffraction of light in the first display area AA1 of the display panel 100 can be reduced.

In some embodiments, an orthographic projection of each of the first light-emitting structures 112 on the substrate 101 includes one second graphic unit or at least two second graphic units jointed together, and the second graphic unit includes at least one selected from a group including a round shape, an oval shape, a dumb-bell shape, a gourd shape and a rectangle shape, and the diffraction of light in the first display area AA1 of the display panel 100 can be reduced.

In some embodiments, each of the second pixel units includes a plurality of second sub-pixels. Each of the second sub-pixels includes a second pixel electrode, a second light-emitting structure on the second pixel electrode and a second common electrode on the second light-emitting structure.

In some embodiments, each of the second pixel circuit units includes a plurality of second pixel circuits, and each of the second pixel circuits is electrically connected with a second pixel electrode of a corresponding second sub-pixel.

Figure 6:
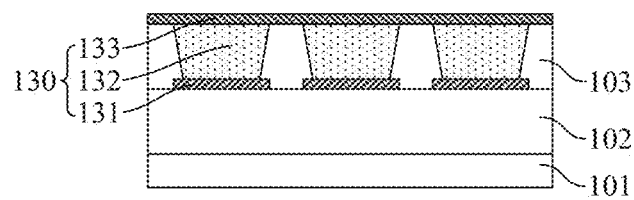

FIG. 6 shows a cross-sectional view taken along the line N-N in FIG. 3a. In some embodiments, each of the third pixel units PU3 includes a plurality of third sub-pixels 130. Each of the third sub-pixels 130 includes a third pixel electrode 131, a third light-emitting structure 132 on the third pixel electrode 131 and a third common electrode 133 on the third light-emitting structure 132.

In some embodiments, each of the third pixel circuit units CU3 includes a plurality of third pixel circuits 160, and each of the third pixel circuits 160 is electrically connected with a third pixel electrode 131 of a corresponding third sub-pixel 130.

The layer structures of the second sub-pixel and the third sub-pixel 130 are similar to the layer structure of the first sub-pixel 110, which will not be detailed herein.

In some embodiments, each of the third sub-pixels 130 includes two or more third pixel electrodes 131, the number of the third light-emitting structures 132 is the same as the number of the third pixel electrodes 131, the third light-emitting structures 132 and the third pixel electrodes 131 are arranged in one-to-one correspondence. All of the third pixel electrodes 131 in each of the third sub-pixels 130 are electrically connected with each other and electrically connected with a same third pixel circuit 160. When the number of the third pixel electrodes 131 in each of the third sub-pixels 130 is two or more, the colors of the light emitted from the third light-emitting structures 132 included in each of the third sub-pixels 130 are the same, so that the plurality of the third light-emitting structures 132 in each of the third sub-pixels 130 are driven by the same third pixel circuit 160 for display.

Exemplarily, the display panel 100 may further include an encapsulation layer and a polarizer and a cover plate located on the encapsulation layer. Alternatively, the cover plate may be directly arranged on the encapsulation layer without the polarizer, or at least the cover plate is directly arranged on the encapsulation layer in the first display area AA1 without the polarizer so as to prevent the polarizer from affecting the light collection amount of the photosensitive assembly correspondingly arranged under the first display area AA1, of course, in some embodiments, the polarizer may also be arranged on the encapsulation layer in the first display area AA1.

In the above embodiments, for example, each of the sub-areas SA accommodates the third pixel circuit unit CU3, which is electrically connected with the corresponding third pixel unit PU3, and one first pixel circuit unit CU1, but it is understood that the number of the first pixel circuit units CU1 accommodated in each of the sub-areas SA is not limited to one.

Figure 7:
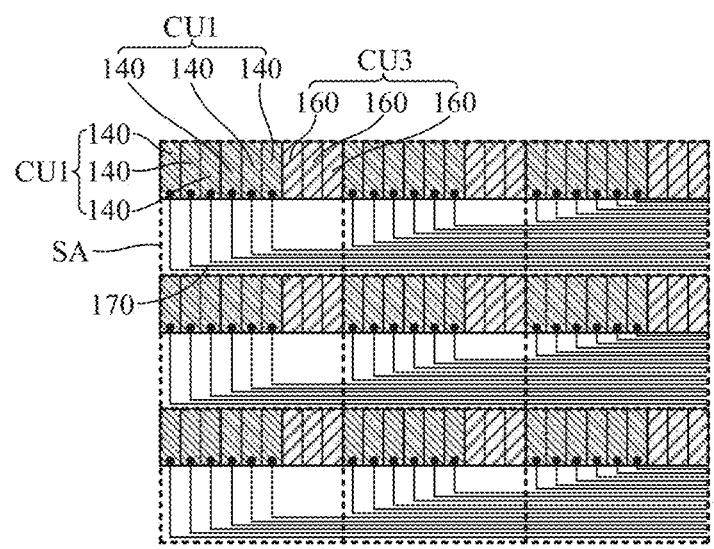
FIG. 7 shows a partial schematic diagram of a top view of a transition display area of a display panel provided according to an alternative embodiment of the present application.

FIG. 7 shows a partial schematic diagram of a top view of a transition display area of a display panel provided according to an alternative embodiment of the present application, in which the third pixel unit PU3 is not shown to conveniently illustrate the relative positional relationship between the first pixel circuit units CU1 and the third pixel circuit units CU3. Herein, a part of the structure of the display panel provided by the alternative embodiment is the same as the structure of the display panel provided by the above embodiments, which will not be detailed herein, and the differences will be described below.

The display panel provided by the alternative embodiment includes a plurality of first pixel units, a plurality of third pixel units PU3, a plurality of first pixel circuit units CU1 and a plurality of third pixel circuit units CU3. The transition display area TA of the display panel is divided into a plurality of sub-areas SA, and each of the sub-areas SA is an area occupied by a corresponding third pixel unit PU3.

The alternative embodiment differs from the above embodiments in that in addition to the third pixel circuit unit CU3 electrically connected with the corresponding third pixel unit PU3, each of the sub-areas SA further accommodates two first pixel circuit units CU1.

Each of the first pixel circuit units CU1 includes a plurality of first pixel circuits 140, and each of the first pixel circuits 140 is electrically connected with a corresponding first sub-pixel. Each of the third pixel circuit units CU3 includes a plurality of third pixel circuits 160, and each of the third pixel circuits 160 is electrically connected a corresponding third sub-pixel.

The sub-areas SA are arranged in a plurality of rows and a plurality of columns, and the third pixel circuit units CU3 are arranged in a plurality of rows and a plurality of columns. Herein, in each row of the third pixel circuit units CU3, a first interval area is between two adjacent third pixel circuit units CU3, and two first pixel circuit units CU1 are arranged in the first interval area between every two adjacent third pixel circuit units CU3. A second interval area is between two adjacent rows of the third pixel circuit units CU3, and the first pixel circuit units CU1 are electrically connected with the first pixel units of the first display area through lead wires 170 extending in the second interval area, so as to drive the first pixel units of the first display area for display.

In the above embodiments, the number of the first pixel circuit units CU1 accommodated in each of the sub-areas SA are given only for example, and in some other embodiments, each of the sub-areas SA may accommodate other number of the first pixel circuit units CU1 such as 3, 4, and 5. The arrangement of the first pixel circuit units CU1 and the third pixel circuit units CU3 in each of the sub-areas SA are not limited to those in the above examples, the third pixel circuit units CU3 may be arranged at the edge area of each of the sub-areas SA, or may not be arranged at the edge area of each of the sub-areas SA; the third pixel circuit units CU3 may be located at the end of each of the sub-areas SA in the row direction, or may not be located at the end of each of the sub-areas SA in the row direction.

In addition, the number of the first pixel circuits 140 included in each of the first pixel circuit units CU1 and the number of the third pixel circuits 160 included in each of the third pixel circuit units CU3 are not limited to those in the above examples, and may be configured according to the number of the first sub-pixels 110 included in each of the first pixel units PU1 and the number of the third sub-pixels 130 included in each of the third pixel units PU3.

The embodiments of the present application further provide a display apparatus which may include the display panel 100 of any one of the above embodiments. A display apparatus of an embodiment will be described below as an example, in which the display apparatus includes the display panel 100 of the above embodiments.

Figure 8:
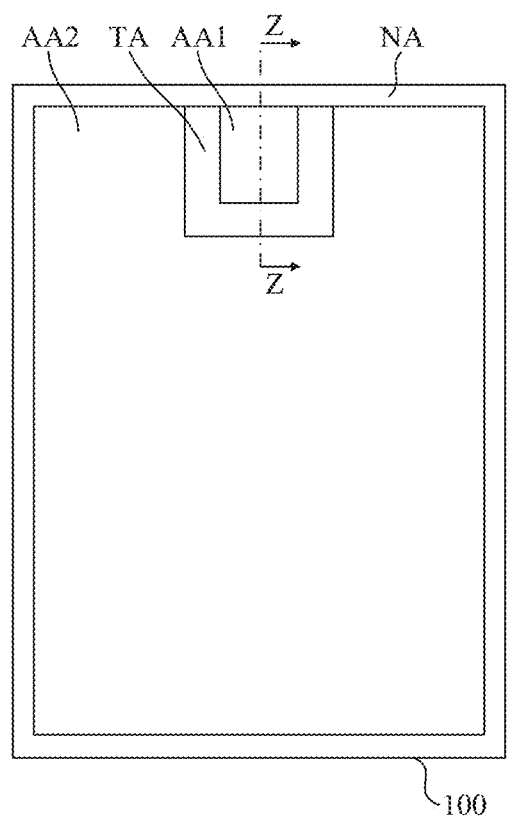
FIG. 8 shows a top view of a display apparatus provided according to an embodiment of the present application.
Figure 9:
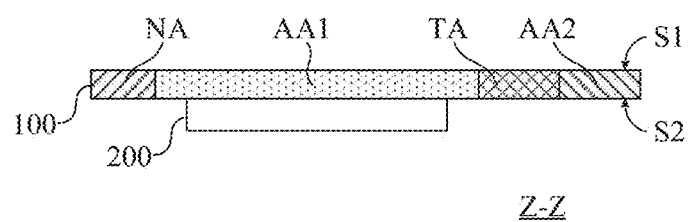
FIG. 9 shows a cross-sectional view taken along the line Z-Z in FIG. 8.

FIG. 8 shows a top view of a display apparatus provided according to an embodiment of the present application, and FIG. 9 shows a cross-sectional view taken along the line Z-Z in FIG. 8. In the display apparatus of the embodiment, the display panel 100 may be the display panel 100 of one of the above embodiments, in which the display panel 100 includes a first display area AA1, a second display area AA2 and a transition display area TA between the first display area AA1 and the second display area AA2. In some embodiments, the display panel 100 further includes a non-display area NA surrounding the first display area AA1 and the second display area AA2. The light transmittance of the first display area AA1 is greater than the light transmittance of the second display area AA2.

The display panel 100 includes a first surface S1 and a second surface S2 opposite to each other, in which the first surface S1 is a display surface. The display apparatus further includes a photosensitive assembly 200 on a side of the display panel 100 corresponding to the second surface S2 of the display panel 100, and the photosensitive assembly 200 corresponds to the first display area AA1 of the display panel 100.

The photosensitive assembly 200 may be an image capturing device for capturing external image information. In the embodiment, the photosensitive assembly 200 is a complementary metal oxide semiconductor (Complementary Metal Oxide Semiconductor, CMOS) image capturing device, and in some other embodiments, the photosensitive assembly 200 may also be other image capturing device such as a charge-coupled device (Charge-coupled Device, CCD) image capturing device. It may be appreciated that the photosensitive assembly 200 may not be limited to an image capturing device. For example, in some embodiments, the photosensitive assembly 200 may also be a light sensor such as an infrared sensor, a proximity sensor, an infrared lens, a flood light sensing element, an ambient light sensor and a dot projector. In addition, other components such as a telephone receiver and a speaker may also be integrated on a side of the display panel 100 corresponding to the second surface S2 of the display panel 100 of the display apparatus.

According to the display apparatus of the embodiments of the present application, the light transmittance of the first display area AA1 is greater than the light transmittance of the second display area AA2, so that the photosensitive assembly 200 may be integrated on the rear of the first display area AA1 of the display panel 100. An under-screen integration is achieved for the photosensitive assembly 200 such as an image capturing device, and moreover, the first display area AA1 can display the image, so the display area of the display panel 100 is increased and a full-screen design is achieved for the display apparatus.

The display panel 100 includes a plurality of first pixel units PU1, a plurality of second pixel units, a plurality of third pixel units PU3, a plurality of first pixel circuit units CU1 a plurality of second pixel circuit units and a plurality of third pixel circuit units CU3. The first pixel units PU1 are in the first display area AA1, the second pixel units are in the second display area AA2, and the third pixel units PU3 are in the transition display area TA. The first pixel circuit units CU1 are in the transition display area TA and electrically connected with the first pixel units PU1 to drive the first pixel units PU1 for display. The second pixel circuit units are in the second display area AA2 and electrically connected with the second pixel units to drive the second pixel units for display. The third pixel circuit units CU3 are in the transition display area TA and electrically connected with the third pixel units PU3 to drive the third pixel units PU3 for display.

According to the display panel 100 of the embodiments of the present application, the first pixel circuit units CU1 configured to drive the first pixel units PU1 for display are in the transition display area TA, so that the wiring structure of the first display area AA1 is reduced and the light transmittance of the first display area AA1 is improved.

The transition display area TA is divided into a plurality of sub-areas SA, and each of the sub-areas SA accommodates a third pixel circuit unit CU3, which is electrically connected with the corresponding third pixel unit PU3, and at least one first pixel circuit unit CU1. Each of the third pixel circuit units CU3 in the transition display area TA is in an area occupied by the third pixel unit PU3 which is correspondingly driven by the third pixel circuit unit CU3, and the third pixel circuit unit CU3 and the corresponding third pixel unit PU3 are closer to each other, which facilitates the electric connection between them and avoids the need for a long lead wire to achieve the electric connection. Therefore, more wiring space in the transition display area TA can be saved, the arrangement of the lead wires for connecting the first pixel circuits units CU1 and the first pixel units PU1 is facilitated, and the problem of wiring conflict of the first pixel circuit units CU1 and the third pixel circuit units CU3 in the transition display area TA is avoided. More space of the transition display area TA is used to arrange the lead wires for connecting the first pixel circuit units CU1 and the first pixel units PU1, so that a greater number of the lead wires can be arranged, which provides a driving basis for an increase of the pixel density of the first display area AA1.

The above embodiments of the present application do not exhaustively describe all the details, nor do they limit the present application to merely the specific embodiments described. Obviously, according to the above description, many modifications and changes can be made. These embodiments are selected and specifically described in the specification to better explain the principles and practical applications of the present application, so that those skilled in the art are able to make good use of the present application and make modifications on the basis of the present application. The present application is only defined by the claims and their full scope and equivalents.

What is claimed is:

1. A display panel, comprising:
a first display area, a second display area, and a transition display area between the first display area and the second display area, a light transmittance of the first display area being greater than a light transmittance of the second display area; the display panel further comprising: a plurality of first pixel units disposed in the first display area;
a plurality of third pixel units disposed in the transition display area;
a plurality of first pixel circuit units disposed in the transition display area and electrically connected with the first pixel units, the first pixel circuit units being configured to drive the first pixel units for display; and
a plurality of third pixel circuit units disposed in the transition display area and electrically connected with the third pixel units, the third pixel circuit units being configured to drive the third pixel units for display,
wherein the transition display area is divided into a plurality of sub-areas, each of the sub-areas is an area occupied by a corresponding one of the plurality of third pixel units, and each of the sub-areas accommodates one of the plurality of third pixel circuit units, which is electrically connected with the corresponding third pixel unit, and at least one of the plurality of first pixel circuit units.

2. The display panel of claim 1, wherein the sub-areas are arranged in a plurality of rows and a plurality of columns, and the third pixel circuit units are arranged in a plurality of third pixel circuit rows and a plurality of third pixel circuit columns.

3. The display panel of claim 2, wherein in each of the plurality of third pixel circuit rows, a first interval area is disposed between at least two adjacent third pixel circuit units of the plurality of third pixel circuit units, and the at least one of the plurality of first pixel circuit units is disposed in the first interval area.

4. The display panel of claim 2, wherein a second interval area is disposed between two adjacent third pixel circuit rows, and the first pixel circuit unit is electrically connected with a corresponding one of the plurality of first pixel units through a lead wire extending in the second interval area.

5. The display panel of claim 1, wherein each of the first pixel units comprises a plurality of first sub-pixels, and each of the first sub-pixels comprises one or more first pixel electrodes, one or more first light-emitting structures disposed on the first pixel electrodes and a first common electrode disposed on the first light-emitting structure.

6. The display panel of claim 5, wherein each of the first pixel circuit units comprises a plurality of first pixel circuits, and each of the first pixel circuits is electrically connected with a first pixel electrode of a corresponding one of the plurality of first sub-pixels.

7. The display panel of claim 5, wherein the one or more first pixel electrodes are two or more first pixel electrodes, a number of the first light-emitting structures is the same as a number of the first pixel electrodes, the first light-emitting structures and the first pixel electrodes are arranged in one-to-one correspondence, and all of the first pixel electrodes in each of the first sub-pixels are electrically connected with each other and electrically connected with a same first pixel circuit.

8. The display panel of claim 5, wherein the display panel further comprises a substrate, an orthographic projection of the first pixel electrode disposed on the substrate comprises one first graphic unit or at least two first graphic units jointed together, and the first graphic unit comprises at least one selected from a group consisting of a round shape, an oval shape, a dumb-bell shape, a gourd shape and a rectangle shape.

9. The display panel of claim 8, wherein an orthographic projection of the first light-emitting structure on the substrate comprises one second graphic unit or at least two second graphic units jointed together, and the second graphic unit comprises at least one selected from a group consisting of a round shape, an oval shape, a dumb-bell shape, a gourd shape and a rectangle shape.

10. The display panel of claim 5, wherein the first pixel electrode is a light-transmitting electrode.

11. The display panel of claim 5, wherein the first pixel electrode is a reflective electrode, and the first pixel electrode comprises a first light-transmitting conductive layer, a reflective layer on the first light-transmitting conductive layer, and a second light-transmitting conductive layer on the reflective layer.

12. The display panel of claim 5, wherein the first light-emitting structure comprises an emitting layer.

13. The display panel of claim 12, wherein the first light-emitting structure further comprises at least one of a hole inject layer, a hole transport layer, an electron inject layer and an electron transport layer.

14. The display panel of claim 1, wherein each of the third pixel units comprises a plurality of third sub-pixels, and each of the third sub-pixels comprises a third pixel electrode, a third light-emitting structure on the third pixel electrode, and a third common electrode on the third light-emitting structure, each of the third pixel circuit units comprises a plurality of third pixel circuits, and each of the third pixel circuits is electrically connected with one or more third pixel electrodes of a corresponding one of the plurality of third sub-pixels.

15. The display panel of claim 14, wherein the one or more third pixel electrodes are two or more third pixel electrodes, a number of third light-emitting structures is the same as a number of the third pixel electrodes, the third light-emitting structures and the third pixel electrodes are arranged in one-to-one correspondence, and all of the third pixel electrodes in each of the third sub-pixels are electrically connected with each other and electrically connected with a same third pixel circuit.

16. The display panel of claim 1, wherein a pixel density of the first display area is different from a pixel density of the second display area, and a pixel density of the transition display area is the same as the pixel density of the first display area or the pixel density of the second display area.

17. The display panel of claim 1, further comprising:
a substrate;
a component layer disposed on the substrate; and
a pixel defining layer disposed on the component layer and comprising a pixel opening for accommodating at least a part of a structure of each of a plurality of sub-pixels of the display panel.

18. The display panel of claim 1, wherein the light transmittance of the first display area is greater than or equal to 15%.

19. A display apparatus comprising the display panel of claim 1.

20. The display apparatus of claim 19, wherein the display panel further comprises a first surface and a second surface opposite to each other, wherein the first surface is a display surface;

the display apparatus further comprises a photosensitive assembly disposed on a side of the display panel corresponding to the second surface of the display panel, and the photosensitive assembly corresponds to the first display area of the display panel.

\* \* \* \* \*